(12) United States Patent
Hartwich

(10) Patent No.: US 9,600,425 B2
(45) Date of Patent: Mar. 21, 2017

(54) METHOD AND DEVICE FOR ADAPTING THE DATA TRANSMISSION RELIABILITY IN A SERIAL BUS SYSTEM

(75) Inventor: Florian Hartwich, Reutlingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 143 days.

(21) Appl. No.: 14/009,774

(22) PCT Filed: Mar. 29, 2012

(86) PCT No.: PCT/EP2012/055579
§ 371 (c)(1),
(2), (4) Date: Feb. 11, 2014

(87) PCT Pub. No.: WO2012/136546
PCT Pub. Date: Oct. 11, 2012

(65) Prior Publication Data
US 2014/0157080 A1    Jun. 5, 2014

(30) Foreign Application Priority Data

Apr. 6, 2011   (DE) .......... 10 2011 006 875
Jun. 29, 2011  (DE) .......... 10 2001 078 266
Aug. 5, 2011   (DE) .......... 10 2011 080 476

(51) Int. Cl.
*H03M 13/09*    (2006.01)
*G06F 13/362*   (2006.01)
(Continued)

(52) U.S. Cl.
CPC ........ *G06F 13/362* (2013.01); *G06F 13/4282* (2013.01); *H03M 13/091* (2013.01);
(Continued)

(58) Field of Classification Search
CPC ....... H03M 13/091; H04L 2012/40215; H04L 12/4013; H04L 2001/0094;
(Continued)

(56) References Cited

U.S. PATENT DOCUMENTS 5,448,561 A   9/1995  Kaiser et al.
5,559,963 A   9/1996  Gregg et al.
(Continued)

FOREIGN PATENT DOCUMENTS

CN    1433543 A    7/2003
CN    1534422      10/2004
(Continued)

OTHER PUBLICATIONS

International Search Report, PCT International Application No. PCT/EP2012/055596, dated Aug. 22, 2012.
(Continued)

*Primary Examiner* — Albert Decady
*Assistant Examiner* — Kyle Vallecillo
(74) *Attorney, Agent, or Firm* — Norton Rose Fulbright US LLP

(57) ABSTRACT

A method for serial data transmission in a bus system having at least two subscribed data processing units, the data processing units exchanging messages via the bus, the transmitted messages having a logical structure in accordance with the CAN standard ISO 11898-1, the logical structure including a start-of-frame bit, an arbitration field, a control field, a data field, a CRC field, an acknowledge field and an end-of-frame sequence, the control field including a data length code, which contains information regarding the length of the data field. The CRC field of the transmitted messages may have at least two different numbers of bits as a function of the content of the data length code.

18 Claims, 7 Drawing Sheets

Standard Format

Extended Format

SOF = Start Of Frame
RTR = Remote Transmission Request
SRR = Substitute Remote Request
IDE = Identifier Extension Bit

(51) Int. Cl.
*G06F 13/42* (2006.01)
*H04L 12/40* (2006.01)
*H04L 12/413* (2006.01)
*H04L 1/00* (2006.01)

(52) U.S. Cl.
CPC ........ *H04L 1/0083* (2013.01); *H04L 12/4013* (2013.01); *H04L 12/40169* (2013.01); *H04L 12/4135* (2013.01); *H04L 1/0061* (2013.01); *H04L 2001/0094* (2013.01); *H04L 2012/40215* (2013.01)

(58) Field of Classification Search
CPC ........... H04L 12/40169; H04L 12/4135; H04L 1/0083; H04L 1/0061; G06F 13/4282; G06F 13/362
See application file for complete search history.

(56) References Cited

U.S. PATENT DOCUMENTS

| | | | |
|---|---|---|---|
| 5,610,945 | A | 3/1997 | Gregg et al. |
| 5,734,826 | A * | 3/1998 | Olnowich ......... G06F 15/17337 370/410 |
| 5,748,923 | A * | 5/1998 | Eitrich ........................ 710/305 |
| 6,088,342 | A | 7/2000 | Cheng et al. |
| 6,145,024 | A | 11/2000 | Maezawa et al. |
| 6,606,670 | B1 | 8/2003 | Stoneking et al. |
| 7,100,196 | B2 | 8/2006 | Fredriksson |
| 7,168,024 | B2 | 1/2007 | Farnsworth |
| 7,181,668 | B2 | 2/2007 | Ahmed et al. |
| 7,188,207 | B2 | 3/2007 | Mitter |
| 7,330,918 | B2 | 2/2008 | Yamamoto et al. |
| 7,430,261 | B2 | 9/2008 | Forest et al. |
| 7,433,354 | B2 | 10/2008 | Scherer et al. |
| 7,512,827 | B2 | 3/2009 | Steffan |
| 7,599,377 | B2 | 10/2009 | Jordan et al. |
| 7,602,779 | B2 | 10/2009 | Kato et al. |
| 7,675,877 | B2 | 3/2010 | Lee |
| 7,693,086 | B2 | 4/2010 | Honda |
| 7,738,462 | B2 | 6/2010 | Hwang |
| 7,801,162 | B2 | 9/2010 | Jeon et al. |
| 7,826,479 | B2 | 11/2010 | Fujimori |
| 7,991,351 | B2 | 8/2011 | Kuban |
| 8,320,262 | B2 | 11/2012 | Fuehrer et al. |
| 8,324,868 | B2 | 12/2012 | Choi et al. |
| 8,351,785 | B2 | 1/2013 | Luo et al. |
| 8,352,809 | B2 | 1/2013 | Kabulepa et al. |
| 8,375,217 | B2 | 2/2013 | Schmidt |
| 8,448,035 | B2 | 5/2013 | Yamamoto et al. |
| 8,509,257 | B2 | 8/2013 | Yakashiro |
| 8,560,125 | B2 | 10/2013 | Wallaert et al. |
| 8,774,210 | B2 | 7/2014 | Grohman |
| 9,032,124 | B2 | 5/2015 | Elend |
| 9,088,433 | B2 | 7/2015 | Roettgermann et al. |
| 9,091,551 | B2 | 7/2015 | Hannan et al. |
| 9,209,942 | B2 | 12/2015 | Takada et al. |
| 2002/0041688 | A1 * | 4/2002 | Fredriksson .................. 380/270 |
| 2004/0015603 | A1 | 1/2004 | Griessbach et al. |
| 2005/0010762 | A1 | 1/2005 | Schmidt |
| 2005/0086571 | A1 * | 4/2005 | Farnsworth ........... H03M 13/03 714/758 |
| 2005/0141565 | A1 | 6/2005 | Forest et al. |
| 2006/0037008 | A1 * | 2/2006 | Stelzer et al. ................. 717/136 |
| 2007/0091932 | A1 * | 4/2007 | Hwang ........................ 370/475 |
| 2007/0189323 | A1 | 8/2007 | Swoboda et al. |
| 2009/0192051 | A1 * | 7/2009 | Carman ........................ 507/117 |
| 2009/0206798 | A1 | 8/2009 | Choi et al. |
| 2009/0322492 | A1 | 12/2009 | Hannan et al. |
| 2010/0106810 | A1 | 4/2010 | Grohman |
| 2010/0131816 | A1 | 5/2010 | Yamamoto et al. |
| 2010/0150176 | A1 | 6/2010 | Yakashiro |
| 2010/0158045 | A1 | 6/2010 | Shin et al. |
| 2010/0192051 | A1 | 7/2010 | Kabulepa et al. |
| 2011/0125940 | A1 | 5/2011 | Aue et al. |
| 2012/0307836 | A1 | 12/2012 | Ishigooka et al. |
| 2013/0166800 | A1 | 6/2013 | Bosse et al. |
| 2014/0334300 | A1 | 11/2014 | Horihata et al. |

FOREIGN PATENT DOCUMENTS

| | | |
|---|---|---|
| CN | 1860742 A | 11/2006 |
| CN | 101018179 A | 8/2007 |
| CN | 101057295 A | 10/2007 |
| CN | 101208674 | 6/2008 |
| CN | 101572641 A | 11/2009 |
| CN | 101626333 | 1/2010 |
| CN | 101814230 A | 8/2010 |
| CN | 101873299 A | 10/2010 |
| CN | 101884196 | 11/2010 |
| DE | 103 11 395 | 9/2004 |
| DE | 10 2004 055684 | 5/2006 |
| DE | 10 2007 051 657 | 4/2009 |
| JP | 2001-339412 A | 12/2001 |
| JP | 2010-258990 A | 11/2010 |
| JP | 2010-272971 A | 12/2010 |
| RU | 2 337 497 C2 | 10/2008 |
| RU | 2 364 040 C2 | 8/2009 |
| TW | 200941974 A | 10/2009 |
| WO | 2013/000916 A1 | 1/2013 |

OTHER PUBLICATIONS

"Road Vehicles—Controller Area Network (CAN)—Part 1: Data Link Layer and Physical Signalling; ISO 11898-1-2003", IEEE Draft; 130+11898-1-2003, IEEE-SA, Nov. 18, 2010, pp. 1-52.

G. Cena and A. Valezano "Overlocking of controller area networks" Electronics Letters, vol. 35, No. 22 (1999).

Unruh, J., et al, "Error Detection Analysis of Automotive Communication Protocols," (1990), *SAE transactions* 99.6, pp. 976-985, Detroit, USA.

Vieweg, F., et al. "Bosch Kraftfahrtechnisches Handbuch", $27^{th}$ Edition, 2011, pp. 852-862, 1074-1084 and 1086-1119.

ISO 16845: Road Vehicles—Controller Area Network (CAN)—Conformance Test Plan, 2004.

ISO 11898-1-5: Road Vehicles—Controller Area Network (CAN)—Part 5: High-speed Medium Access Unit with Low-power Mode, 2007.

International Standard ISO/DIS 16845 Road Vehicles—Controller Area Network (CAN)—Conformance test plan, (2004), pp. 1-81.

International Standard ISO 11898-1:2003/Cor.1:2006 Road Vehicles—Controller area network (CAN)—Part 1: Data link layer and physical signaling, (2006) pp. 1-6.

International Standard ISO 11898-2:2003 Road Vehicles—Controller area network (CAN)—Part 2: High-speed medium access unit, (2003), pp. 1-21.

International Standard ISO 11898-3:2006 Road Vehicles—Controller area network (CAN)—Part 3: Low-speed, fault-tolerant, medium-dependent interface, (2006), pp. 1-2.

International Standard ISO 11898-4:2004 Road Vehicles—Controller area network (CAN)—Part 4: Time-triggered communication, (2004), pp. 1-32.

* cited by examiner

Standard Format

Extended Format

SOF = Start Of Frame
RTR = Remote Transmission Request
SRR = Substitute Remote Request
IDE = Identifier Extension Bit Standard Format Extended Format Standard CAN

| DLC  |              | DLC 1       | DLC 2 | DLC 3     | DLC 4     |
|------|--------------|-------------|-------|-----------|-----------|
| 0000 | 0 (not used) | 0 (not used)| 16    | remote f. | remote f. |
| 0001 | 1            | 1           | 1     | 1         | 2         |
| 0010 | 2            | 2           | 2     | 2         | 4         |
| 0011 | 3            | 3           | 3     | 3         | 6         |
| 0100 | 4            | 4           | 4     | 4         | 8         |
| 0101 | 5            | 5           | 5     | 5         | 10        |
| 0110 | 6            | 6           | 6     | 6         | 12        |
| 0111 | 7            | 7           | 7     | 7         | 14        |
| 1000 | 8            | 8           | 8     | 8         | 16        |
| 1001 | 8            | 9           | 9     | 10        | 18        |
| 1010 | 8            | 10          | 10    | 12        | 20        |
| 1011 | 8            | 11          | 11    | 14        | 22        |
| 1100 | 8            | 12          | 12    | 16        | 24        |
| 1101 | 8            | 13          | 13    | 18        | 26        |
| 1110 | 8            | 14          | 14    | 20        | 28        |
| 1111 | 8            | 15          | 15    | 24        | 30        |

Fig. 2

Standard Format

Extended Format

Standard Format CAN FD „Fast"

Extended Format CAN FD „Fast"

METHOD AND DEVICE FOR ADAPTING THE DATA TRANSMISSION RELIABILITY IN A SERIAL BUS SYSTEM

FIELD OF THE INVENTION

The present invention relates to a method and a device for adapting the data transmission reliability between at least two subscribers in a serial bus system.

BACKGROUND INFORMATION

For example, the ISO standard family 11898-1 through -5 describes the Controller Area Network (CAN) as well as an extension of the CAN called "time-triggered CAN" (TTCAN), referred to in the following also as standard CAN. The media access control method used in the CAN standard is based on a bit-wise arbitration. In bit-wise arbitration, multiple subscriber stations are simultaneously able to transmit data via the channel of the bus system, without thereby interfering with the data transmission. Furthermore, the subscriber stations are able to ascertain the logical state (0 or 1) of the channel while transmitting a bit over the channel. If a value of the transmitted bit does not correspond to the ascertained logical state of the channel, the subscriber station terminates the access to the channel. In CAN, the bit-wise arbitration is usually carried out on the basis of an identifier within a message that is to be transmitted via the channel. After a subscriber station has sent the identifier to the channel in its entirety, it knows that it has exclusive access to the channel. The end of the transmission of the identifier thus corresponds to a beginning of an enable interval, within which the subscriber station is able to use the channel exclusively. According to the CAN protocol specification, other subscriber stations may not access the channel, that is, send data to the channel, until the sending subscriber station has transmitted a checksum field (CRC field) of the message. Thus, an end point of the transmission of the CRC field corresponds to an end of the enable interval.

The bit-wise arbitration thus achieves a non-destructive transmission of those messages via the channel that won the arbitration process. The CAN protocols are particularly suited for transmitting short messages under real-time conditions, a suitable assignment of the identifiers being able to ensure that particularly important messages will almost always win the arbitration and be sent successfully.

With the increasing networking of modern vehicles and the introduction of additional systems for improving driving safety for example or driving comfort, the demands grow on the quantities of data to be transmitted and the latency periods admissible in the transmission. Examples are driving dynamics control systems such as e.g. the electronic stability program ESP, driver assistance systems such as e.g. the automatic distance control ACC, or driver information systems such as e.g. the traffic sign detection (cf. for example descriptions in "Bosch Kraftfahrtechnisches Handbuch" ("Bosch Automotive Handbook"), 27th edition, 2011, Vieweg+Teubner).

Patent document DE 103 11 395 A1 discusses a system in which asynchronous, serial communication is able to take place alternatively via an asymmetrical physical protocol or via the symmetrical physical CAN protocol, and thereby a higher data transmission rate or data transmission reliability is achievable for the asynchronous communication.

Patent document DE 10 2007 051 657 A1 provides for the use of an asynchronous, fast, not CAN-compliant data transmission in the exclusive time windows of the TTCAN protocol in order to increase the transmitted data quantity.

G. Cena and A. Valenzano, in "Overclocking of controller area networks" (Electronics Letters, vol. 35, No. 22 (1999), p. 1924) deal with the effects of overclocking the bus frequency in subsections of the messages on the effectively achieved data rate. The adaptation of data transmission reliability is not discussed.

It is clear that the related art does not provide results that are satisfactory in every respect.

SUMMARY OF THE INVENTION

In the following, the present invention and its advantages will be described with reference to drawings and exemplary embodiments. The subject matter of the present invention is not limited to the represented and described exemplary embodiments.

The present invention is based on the transmission of messages having a logical structure according to the CAN standard ISO 11898-1 in a bus system having at least two subscribed data processing units, the logical structure including a start-of-frame-bit, an arbitration field, a control field, a data field, a CRC field, an acknowledge field and an end-of-frame sequence, and the control field including a data length field, which contains an item of information regarding the length of the data field.

The present invention provides a possibility of using for certain transmitted messages a modified polynomial for calculating the checksum and to transmit a CRC field of a size deviating from standard CAN in that the CRC field of transmitted messages may have at least two different numbers of bits and has for at least one of the valid values of the data length code a number of bits that deviates from the CAN standard ISO 11898-1, and at least one generator polynomial deviating from the CAN standard ISO 11898-1 being used for determining the content of such a CRC field that has a deviating number of bits. This has the advantage that the reliability of error detection is maintained even for larger transmitted quantities of data.

In one particularly advantageous specific embodiment, multiple calculations of checksums are started in parallel at the beginning of a message and, as a function of the content of the data length code, a decision is made as to which result of one of these calculations is used or transmitted in the CRC field. This makes it possible to transmit the information as to whether a message is transmitted according to the standard-conforming method or according to the method modified in accordance with the present invention along with the message, without informing the recipient in advance about the used method. The checksums for checking the correct data transmission exist for both methods and may be evaluated as needed.

By providing an possibility of enlarging the data field of a transmitted message, one advantageous specific embodiment achieves the effect that compared to a standard-conforming CAN message a greater quantity of data may be transmitted over the bus in a single message. This advantageously increases the ratio of data quantity and control information in a message and thus also the average data transmission rate over the bus system.

By establishing an unequivocal correlation between the content of the data length code and the length of the data field, a high flexibility is advantageously achieved with respect to the possible size of the data field.

It is furthermore advantageous that for the values 0b0001 through 0b1000 of the data length code normally used in standard CAN, the sizes of the data field corresponding to the CAN standard, that is, 1 byte through 8 bytes are, assigned and the remaining values of the data length code are used for the additional admissible sizes of the data field up to the maximum admissible size. This cost-effectively reduces the adaptation effort of application software when switching to the method according to the present invention.

It is furthermore advantageous that possibly existing stuff bits, which appear before the CRC field in the message, are also included in the calculation of the checksum. This further improves the reliability of the data transmission or the detection probability for data transmission errors.

If the method is further combined with a switchover of the bit length, for example for at least the bits of the data field and the CRC field, then the further advantage is obtained that a greater quantity of data is transmitted in accelerated fashion than is the case when the data field is limited to 8 bytes. This further increases the average data transmission rate of the bus system. In one advantageous development, the messages having a shortened bit length in this case are identified by an identifier bit in the control field. This allows the switchover of the bit length to occur independently of the switchover of the CRC calculation or the size of the data field, and it is possible to react flexibly to the prevailing conditions of the bus system.

The method is advantageously applicable in the normal operation of a motor vehicle for transmitting data between at least two control units of the motor vehicle, which are connected via a suitable data bus. It may equally be used advantageously during the manufacturing or maintenance of a motor vehicle for transmitting data between a programming unit connected to a suitable data bus for programming purposes and at least one control unit of the motor vehicle that is connected to the data bus. It is also advantageously usable in the industrial field when larger data quantities must be transmitted for example for control purposes. Particularly if a reduced data rate must be applied during the arbitration due to the length of the transmission route so that all subscribers have the opportunity to access the bus, the method makes it possible, in particular in combination with the switchover of the length of the data field and the reduction of the bit length, to achieve a higher data transmission rate.

An additional advantage is that a standard CAN controller only needs to be modified minimally in order to be able to operate in accordance with the present invention. A communications controller according to the present invention, which is also able to work as a standard CAN controller, is only negligibly larger than a conventional standard CAN controller. The associated application program does not need to be modified, and even then advantages in the speed of data transmission are already achieved.

Advantageously, substantial portions of the CAN conformance test (ISO 16845) may be adopted. In one advantageous development, the transmission method according to the present invention may be combined with the supplements of TTCAN (ISO 11898-4).

The present invention will be described in greater detail below on the basis of the drawings.

BRIEF DESCRIPTION OF THE DRAWINGS

FIG. 2 represents various possibilities of how, according to the present invention, the content of the data length code may be interpreted in a manner deviating from the CAN standard ISO 11898-1.

DETAILED DESCRIPTION

Figure 1A:
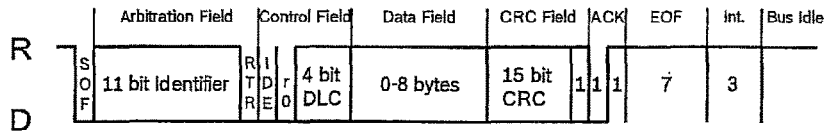
FIG. 1a shows the two alternatives for the structure of messages in the CAN format according to the CAN standard ISO 11898-1 from the related art.
Figure 1A:
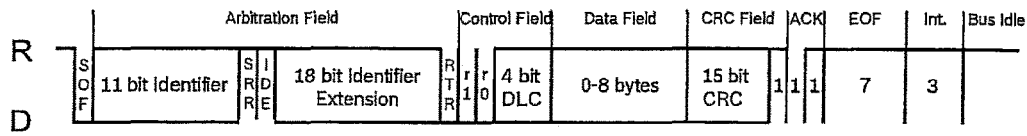

FIG. 1a shows the structure of messages as they are used in a CAN bus for data transmission. The two different formats "standard" and "extended" are shown. The method according to the present invention is equally applicable to both formats.

The message begins with a "start of frame" (SOF) bit, which signals the beginning of the message. This is followed by a section that is used primarily for identifying the message and on the basis of which the subscribers of the bus system decide whether they receive the message or not. This section is called an "arbitration field" and contains the identifier. This is followed by a "control field" containing, among other things, the data length code. The data length code contains information about the size of the data field of the message. This is followed by the actual "data field", which contains the data to be exchanged between the subscribers of the bus system. This is followed by the "CRC field" having the 15-bit checksum and a delimiter, and subsequently two "acknowledge" (ACK) bits, which signal to the sender the successful reception of a message. The message is concluded by an "end of frame" (EOF) sequence.

In the standard CAN transmission method, the data field may contain a maximum of 9 bytes, that is, 64 bits of data. According to the standard, the data length code comprises four bits, which is to say that it can assume 16 distinct values. Of this value range, in today's bus systems, only eight different values are used for the various sizes of the data field from 1 byte to 8 bytes. A data field of 0 bytes is not recommended in standard CAN, and sizes above 8 bytes are not permitted. The assignment of the values of the data length code to the sizes of the data field is shown in FIG. 2 in the standard CAN column.

Figure 1B:
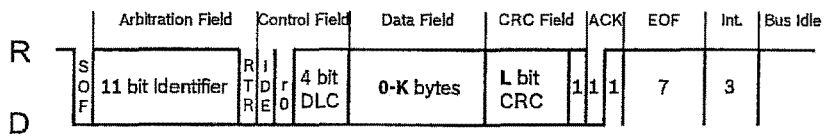
FIG. 1b shows the two analogous alternatives for the format of the respective messages modified in accordance with the present invention.
Figure 1B:
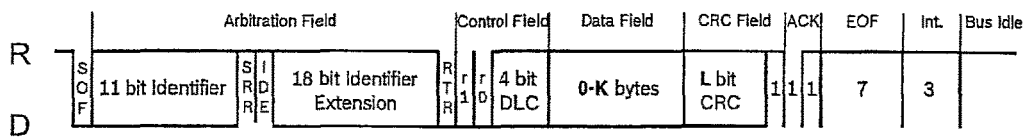

In FIG. 1b, in an analogous representation, the modified messages to be transmitted in accordance with the present invention are juxtaposed, respectively derived from the two standard formats.

In the transmission method modified in accordance with the present invention, the data field may also contain more than 8 bytes, namely, in the represented embodiment, up to K bytes. In contrast to standard CAN, additional values assumable by the data length code are used to identify larger data fields. For example, the four bits of the data length code may be used to represent the values from zero to 15 bytes. Other assignments may also be made, however, one possibility being the use the value of the data length code DLC=0b0000, which is normally not used in today's CAN messages, for another possible size of the data field, for the size of 16 bytes for example. These two possibilities are shown in FIG. 2 in tabular form as DLC 1 and DLC 2. The maximum size of data field K in this case has the value 15 and 16, respectively.

Another possibility is that for the values of the data length code greater than 0b1000 and up to 0b1111, the associated sizes of the data field grow respectively by 2 bytes for example. This case is shown in the table as DLC 3. The maximum size of data field K in this variant reaches the value 24. By selecting a greater increment, for example 4 bytes, greater data fields would be achievable accordingly.

In the DLC 3 example, one additional modification has been made: the value DLC=0b0000 is used in this exemplary embodiment by remote frames. Standard CAN, by contrast, provides for transmitting a remote frame at the same value of the DLC as the message transmitted as a reaction to the remote frame. The modification described here ensures that remote frames having a different DLC and an identical identifier cannot be transmitted, which (cf. ISO 11898-1, chap. 10.8.8) may result in inextricable collisions.

In the embodiments of the method shown in tabular form in FIG. 2 in columns DLC 1, DLC 2 and DLC 3, the assignment of the values from 0b0001 through 0b1000 of the data length code to the sizes of the data field between 1 byte and 8 bytes corresponds to the assignment in standard CAN. In a simple manner, this makes it possible to achieve compatibility to standard CAN, that is, to configure the communications controller in such a way that it works in a standard-conforming manner in a standard CAN bus system, while allowing greater data fields in the messages in a bus system modified in accordance with the present invention. It is also possible, however, to perform a completely new assignment of the possible values of the data length code to admissible sizes of the data field. An example of this is provided as DLC 4 in FIG. 2. In this case, the achieved maximum size K of the data field is 30 bytes.

To ensure that such a communications controller is able to determine in what manner it must interpret the contents of the data length code, it is advantageous for the communications controller to recognize independently whether the communication of the bus system occurs according to standard CAN or according to the method of the present invention. One possibility for this is to use a reserved bit within the arbitration field or the control field for identification such that from this first identification K1 the communications controller is able to derive a first switchover condition UB1, on the basis of which it selects the transmission method. For example, the second bit of the control field indicated by r0 in FIG. 1b may be used for identification. Another possibility is to use the SRR bit, which in standard CAN must always be transmitted recessively, but which is accepted also dominantly by the bus subscribers receiving the message. It is also possible to evaluate bit combinations to determine the first switchover condition UB1.

Another possibility would be to prescribe the use of the extended format for the transmission method modified in accordance with the present invention. Messages in the extended format are recognized by bus subscribers on the basis of the value of the IDE bit (cf. FIG. 1a), and this bit could at the same time represent the first switchover condition UB1 such that the modified transmission method is always used for extended messages. Alternatively, it would also be possible in extended messages to use the reserved bit r1 as a first identification K1 or for deriving the first switchover condition UB1. As explained further below, the reserved bit may also be used for deriving a second switchover condition UB2 for switching between more than two different sizes of the data field or assignments between values of the data length code and data field sizes.

Alternatively, it is also possible to apply the method in suitable communications controllers that are not also configured for standard-conforming CAN communication. In this case, the determination of the mentioned first switchover condition UB1, for example as a function of a suitable identification K1 of the messages, may also be dropped. In this case, the communications controllers rather operate exclusively according to one of the described methods and are accordingly usable only in bus systems in which such communications controllers according to the present invention are used exclusively. The bit or bits within the message, which were otherwise used for identifying the messages according to the present invention in contrast to standard-conforming messages, may also be omitted in this case or are ignored by the subscribers of the communication with respect to the method of data transmission.

If, as provided in the present invention, the data field of messages is enlarged, then it may be practical to adapt also the method utilized for the cyclic redundancy check (CRC) in order to obtain a sufficient immunity against error. In particular, it may be advantageous to use a different CRC polynomial, for example of a higher order, and accordingly to provide a CRC field of a deviating size in the messages modified in accordance with the present invention. This is indicated in FIG. 1b by the fact that the CRC field of the messages of the present invention has a length of L bits in the example provided, it being possible for L to be unequal to, in particular greater than, 15, in deviation from standard CAN.

The use of a modified method for calculating the CRC checksum may be signaled to the bus subscribers by a third identification K3, which represents a third switchover condition UB3. This identification K3 and the third switchover condition UB3, however, may also agree with the first identification K1 and/or switchover condition UB1. Here too, as was described further above, the reserved bit r0 from FIG. 1b may be used for identification for example, or the SRR bit may be used. A use of the IDE bit in combination with the application of the method in extended messages or even of the r1 bit is also possible.

In standard CAN controllers, the CRC code of CAN messages to be transmitted is generated by a feedback shift register, the serially transmitted bits of the message being fed sequentially into its input. The width of the shift register corresponds to the order of the CRC polynomial. The CRC encoding occurs by combining the register content with the CRC polynomial during the shift operations. When CAN messages are received, the serially received bits of the message are accordingly shifted into the CRC shift register. The CRC test is successful if at the end of the CRC field all bits of the shift register are at zero. The CRC code generation in the sending case and the CRC test in the receiving case both occur in hardware without requiring an intervention of the software. A modification of the CRC encoding thus does not affect the application software.

In the standard CAN protocol, the stuff bits within the CAN messages (cf. ISO 11898-1, chap. 10.5) are not included in the calculation or checking of the CRC code (cf. ISO 11898-1, chap. 10.4.2.6: " . . . the bit stream given by the destuffed bit sequence . . . "). This has the consequence that in rare cases two bit errors in one message are not detected even though the CRC should as such detect up to five randomly distributed bit errors in one message. This may occur when, as a result of the bit errors, stuff bits transform into data bit and vice versa (cf. Unruh, Mathony and Kaiser: "Error Detection Analysis of Automotive Communication Protocols", SAE International Congress, No. 900699, Detroit, USA, 1990).

In the transmission method modified in accordance with the present invention, by contrast, the CRC encoding may be changed in such a way that the stuff bits within the message are also included in the calculation or checking of the CRC codes. That is to say that in this specific embodiment the stuff bits belonging to the arbitration field, control field and data field are treated as part of the data to be protected by the cyclic redundancy check. As in standard CAN, the stuff bits of the CRC field are disregarded.

In one possible specific embodiment, the communications controller is configured in such a way that it is compatible with the standard CAN, that is, it works in a standard-conforming fashion in a standard CAN bus system, while in a bus system modified in accordance with the present invention is allows for larger data fields in the messages on the one hand and on the other hand also performs the adapted calculation and checking of the CRC code.

Since at the start of the reception of a message it is not yet clear whether a standard-conforming CAN message or a message modified in accordance with the present invention is received, two CRC shift registers are implemented in a communications controller according to the present invention, which work in parallel. Following the reception of the CRC delimiter, when the CRC code is evaluated in the receiver, it is clear from the third identification K3 according to the present invention or from the third switchover condition UB3 derived from the identification or the content of the data length code, for example, which transmission method was used, and the shift register associated with this transmission method is then evaluated. As already explained above, the third switchover condition UB3 may agree with the first switchover condition UB1, which concerns the size of the data field and the interpretation of the data length code.

To be sure, it is already clear for the sender at the beginning of sending a message according to which transmission method a transmission is to occur. Since it could happen, however, that the arbitration regarding bus access is lost and the started message is not sent, but instead a different message is received, both CRC shift registers are activated in parallel in this case as well.

The described implementation of two CRC shift registers working in parallel also allows for another improvement:

The CRC polynomial of the standard CAN protocol ($x15+x14+x10+x8+x7+x4+x3+1$) is configured for a message length of less than 127 bits. If messages transmitted in accordance with the present invention also use longer data fields, then it is practical to use a different, in particular longer, CRC polynomial in order to maintain transmission reliability. The messages transmitted in accordance with the present invention accordingly receive a modified, in particular longer, CRC field. In ongoing operation, the communications controllers switch dynamically between the two CRC shift registers, that is, between the standard CAN-conforming shift register and the shift register of the present invention, in order to use the respectively fitting polynomial.

Of course, more than two shift registers and accordingly more than two CRC polynomials may also be used, graduated as a function of the length of the data field or the desired transmission reliability. In this case, if a compatibility with the standard CAN is to be maintained, the corresponding identification and the associated switchover condition must be adapted. For example, a first switchover condition UB1 could be triggered by the reserved r0 bit or the SRR bit in FIG. 1b, which indicates a switchover to longer data fields, for example according to DLC 1 in FIG. 2, and an associated second CRC polynomial. For messages in the extended format, additionally a second switchover condition UB2 could be triggered, perhaps indicated by the reserved bit r1 or the IDE bit in FIG. 1b (second identification K2), which indicates the switchover to another set of data field sizes, for example DLC 3 from FIG. 2, and a third CRC polynomial.

It is incidentally also possible that first switchover condition UB1 switches over to the option of longer data fields and the corresponding interpretation of the content of the data length code, perhaps via the reserved bit r0 or the SRR bit, and that the ascertainment of the third switchover condition UB3 and accordingly the selection of the CRC polynomial to be evaluated for the CRC check then occurs as a function of the content of the data length code. Third switchover condition UB3 may accordingly also assume more than two values. For example, the data field sizes could be selected according to DLC 3, that is, assume the values 0 (for remote frames) 1, . . . , 8, 10, 12, 14, 16, 18, 20 and 24 bytes, and three CRC polynomials could then be calculated in parallel via suitable shift registers, for example the standard CRC polynomial for data fields up to 8 bytes, a second CRC polynomial for data fields up to 16 bytes and a third CRC polynomial for data fields up to 24 bytes.

Figure 3:
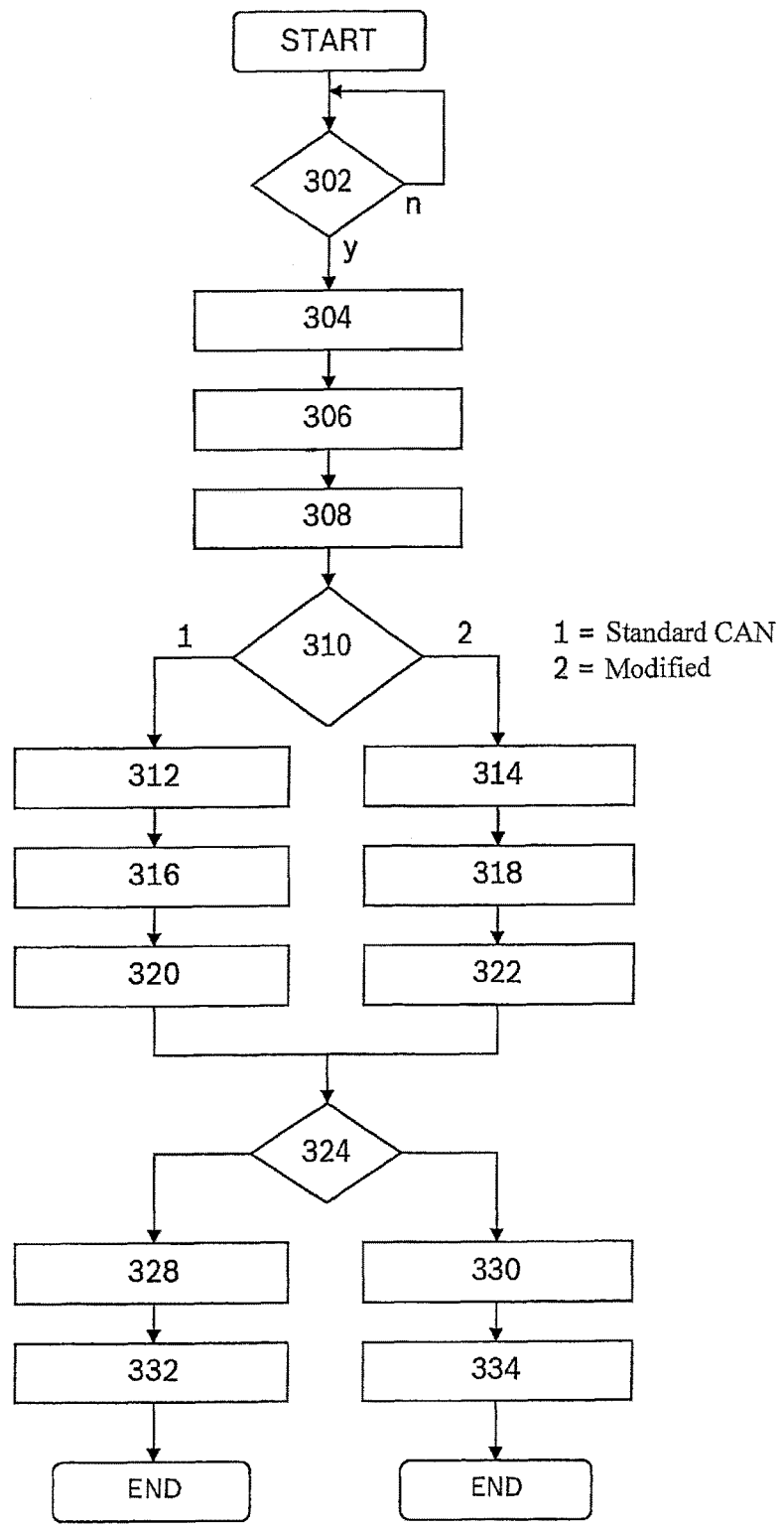
FIG. 3 schematically shows an exemplary embodiment for the receiving process, according to the present invention, in a subscriber station of the bus system.

FIG. 3 shows in a simplified representation a segment of the receiving process according to the present invention, as it occurs in a subscriber station of the bus system. The case shown is one in which a compatibility with the standard CAN is achieved in that the behavior of the communications controller is adapted as a function of the first switchover condition UB1. Although FIG. 3 shows a representation typical for describing program runs in software, the method is equally completely suited for implementation in hardware. The run represented here is also applicable to specific embodiments in which switchover conditions, for example switchover condition UB1 described above, are omitted. The receiving process is then simplified, however, in that only one of the paths, which are otherwise run through as a function of the corresponding switchover condition, is actually run through. A separate representation of such a simplified flow chart is omitted here.

The subscriber station is first in a bus-scanning state as long as there is no communications traffic on the bus. Query 302 is thus waiting for a dominant bit on the bus. This bit marks the start of a new message.

As soon as the start of a new message has been determined, the calculation of the at least two checksums to be calculated in parallel begins in Block 304. The first checksum corresponds to the CRC calculation of the standard CAN, while the second checksum is calculated according to the new method. In the calculation of the second checksum, the stuff bits are included in the exemplary embodiment shown, whereas this is not the case in the calculation according to the standard CAN. It is also possible, however, not to take the stuff bits into account even for calculating the second checksum, in analogy to the standard CAN.

Subsequently, beginning with step 306, the additional bits of the message following the SOF bit are received, beginning with the arbitration field. If multiple bus subscribers want to send out a message, then the bus subscribers negotiate among themselves in accordance with the usual method of the standard CAN which bus subscriber gains the access to the bus. Block 306 indicates the reception of all bits until first identification K1 has been received or first switchover condition UB1 has been determined. In the examples listed, first switchover condition UB1 is ascertained from the arbitration field, for example from the SRR bit or the IDE bit, or from the control field, for example from a reserved bit of the same (cf. FIG. 1). Subsequently, additional bits of the message may be received in block 308 until, beginning with a specific bit of the message as a function of the ascertained first switchover condition UB1, a different method is followed. This split into different methods is ensured by a corresponding query or branching 310, as shown in the following by way of example.

If it is known at branching 310, for example following the reception of the first two bits of the control field, that according to first switchover condition UB1 the communication occurs in accordance with the CAN standard (the path of FIG. 3 indicated by "1"), then the additional bits of the control field are read in in step 312. From these bits, the data length code is evaluated according to the CAN standard and subsequently, in step 316, the associated set of data, 8 bytes maximum, is received in accordance with the data field. The 15-bit CRC field is then received in step 320. If it is known at branching 324 that the CRC checksum transmitted by the sender agrees with the CRC checksum ascertained by the receiver, then a dominant acknowledge bit is transmitted in block 328. It should be noted that in this case the standard-conforming CRC checksum is compared since the communication occurs according to the CAN standard. If no agreement is ascertained, the acknowledge bit is transmitted recessively (Block 330). This is followed by the ACK delimiter and EOF bits (see FIG. 1b, not shown in FIG. 3).

If, by contrast, it is known at branching 310, for example following the reception of the first two bits of the control field, that according to first switchover condition UB1 the communication method modified in accordance with the present invention is to be applied (the path of FIG. 3 indicated by "2"), then the additional bits of the control field are read in in step 314. From the result, the data length code is ascertained according to the new interpretation, for which some examples are listed in tabular form in FIG. 2. In block 318, the corresponding quantity of data is received, that is, up to 15 bytes for the example DLC 1 from the table in FIG. 2, up to 16 bytes for the example DLC 2, up to 24 bytes for the example DLC 3, and up to 30 bytes for the example DLC 4. The CRC field deviating in accordance with the present invention, being in particular longer, is received in block 322. If it is known at branching 324 that the CRC checksum transmitted by the sender agrees with the CRC checksum ascertained by the receiver, then a dominant acknowledge bit is transmitted in block 328, the comparison in this case being based on the CRC checksum that deviates in accordance with the present invention. Otherwise, the acknowledge bit is transmitted recessively (Block 330). The ACK delimiter and the EOF bits follow in step 332 or 334. This ends a receiving process for a message.

Figure 4:
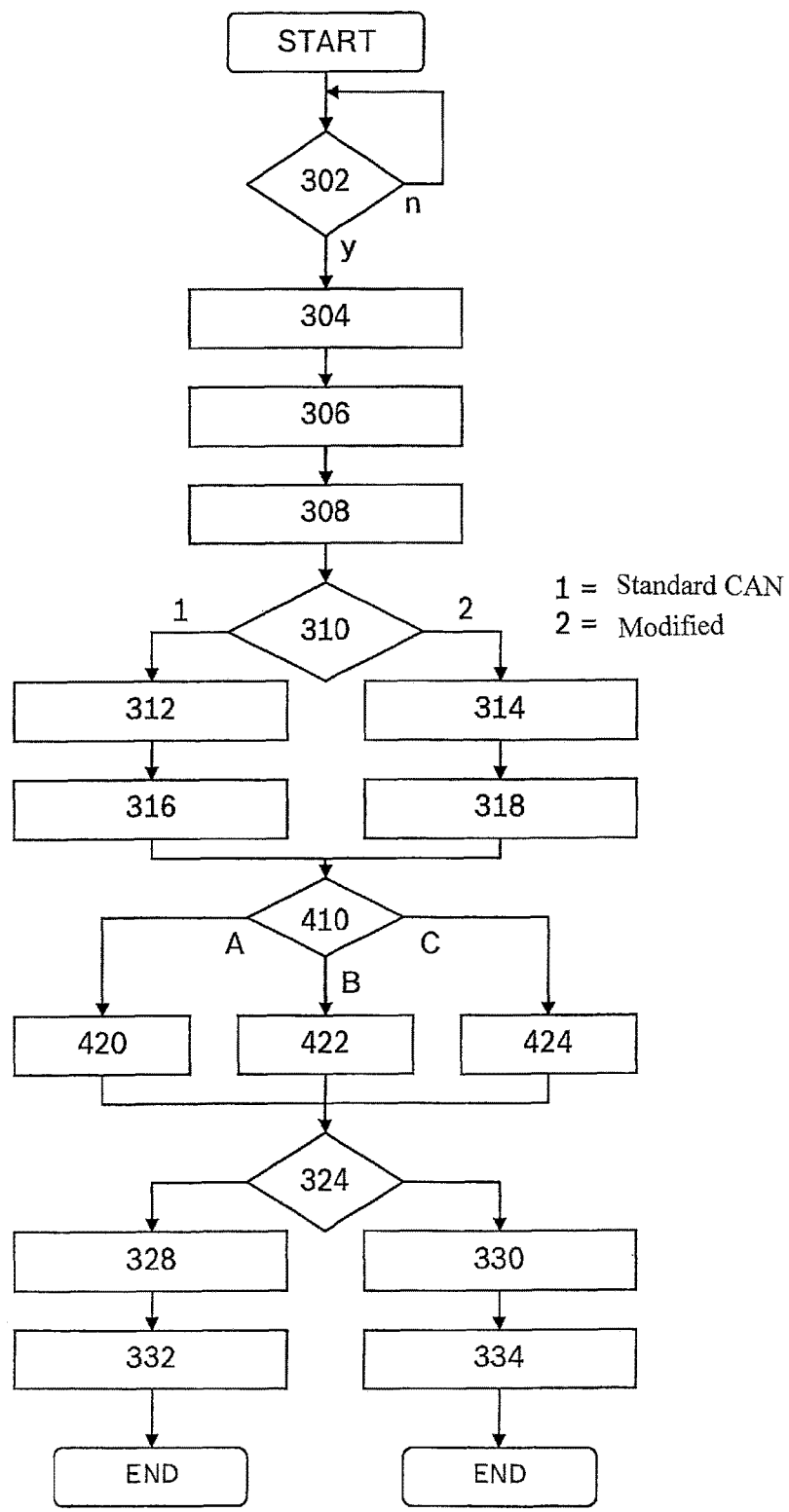
FIG. 4 schematically shows an exemplary embodiment for the receiving process, according to the present invention, in a subscriber station of the bus system.

FIG. 3 shows the case in which third switchover condition UB3, which determines the CRC to be used, agrees with first switchover condition UB1, which concerns the size of the data field and the interpretation of the data length code. Thus, prior to the reception 320 or 322 of the CRC checksums, no additional query was made as to which CRC is to be received according to the third switchover condition UB3 and to be evaluated for branching 324. As shown in FIG. 4, this additional query may be integrated into the process by a simple modification of the flow chart from FIG. 3.

In the reception process modified in this manner, as shown in FIG. 4, following the reception of the number of data bytes of the data field expected according to the information from the data length code, query or branching 410 ascertains the value of switchover condition UB3 in block 316 or 318. As described earlier, this information may have been ascertained for example from the corresponding third identification K3 or from the content of the data length code. In the example shown, there are three different values for third switchover condition UB3: A, B and C. Depending on the value of switchover condition UB3, a different number of bits of the CRC field is then read in in blocks 420, 422 and 424, for example 15 bits for the value A, 17 bits for the value B and 19 bits for the value C. Subsequently, a check is performed in branching 324 analogous to FIG. 3 whether the CRC checksum transmitted by the sender agrees with the CRC checksum ascertained by the receiver, and the further method is selected accordingly.

Figure 5:
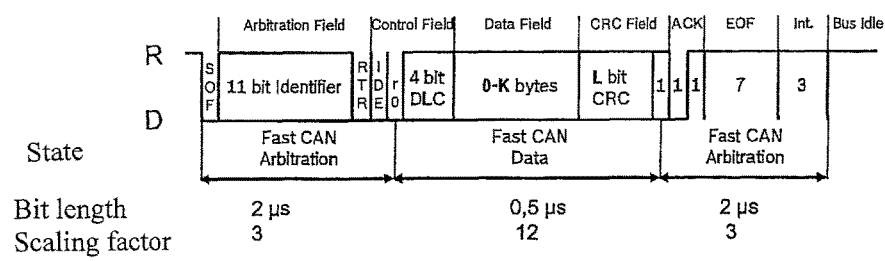
FIG. 5 shows two examples for the format of messages modified in accordance with the present invention, in which additionally a different bit length is used in defined areas within the message.
Figure 5:
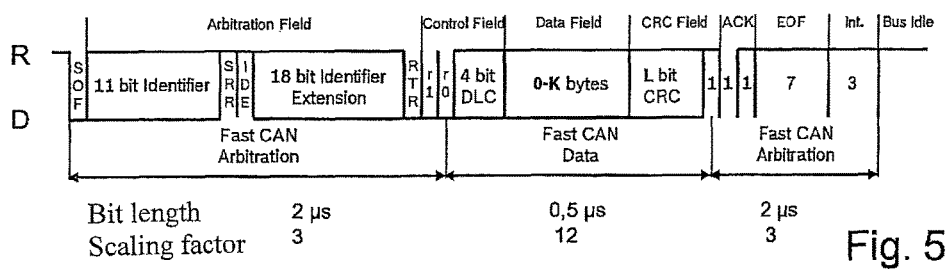

FIG. 5 shows once more the structure of messages in the two possible variants, the standard format and the extended format, for additional exemplary embodiment of the transmission method according to the present invention. Areas are drawn for both variants in FIG. 5, in which a switchover is made between two states, here indicated as Fast CAN Arbitration and Fast CAN Data. This switchover between the two states in this example has the effect that following the conclusion of the arbitration the bit lengths are shortened for a portion of the message, in particular for the data field and the CRC field, and thus the individual bits are transmitted via the bus more quickly. This makes it possible to shorten the transmission time for a message compared to the standard-conforming method. The associated change in the bit length in time may implemented by using at least two different scaling factors for setting the bus time unit relative to a smallest time unit or the oscillator clock pulse in ongoing operation. The switchover of the bit length as well as the corresponding change of the scaling factor are shown in FIG. 5 also by way of example.

The transition between the states of Fast CAN Arbitration and Fast CAN Data may occur as a function of a fourth switchover condition UB4, which corresponds to a fourth identification K4 of the messages, which signals to the subscribers of the data transmission that the shortened bit length is used. In the exemplary embodiment shown here, the chosen position of this identification K4 is the "reserved bit" r0, which is transmitted before the data length code. It thus corresponds to a possible position of first identification K1, which corresponds to first switchover condition UB1 and indicates the possible use of longer data fields and a modified interpretation of the data length code, and also of third identification K3, which corresponds to a modified CRC calculation.

Figure 6:
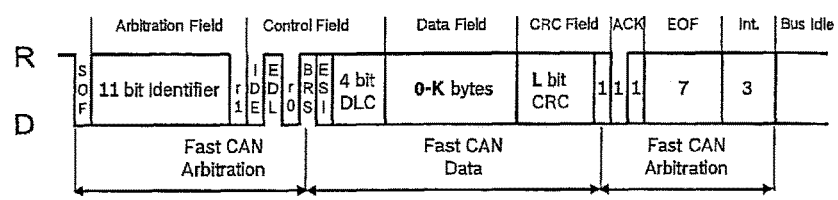
FIG. 6 shows the two possible addressing variants of the messages "CAN FD Fast", the standard format and the extended format.
Figure 6:
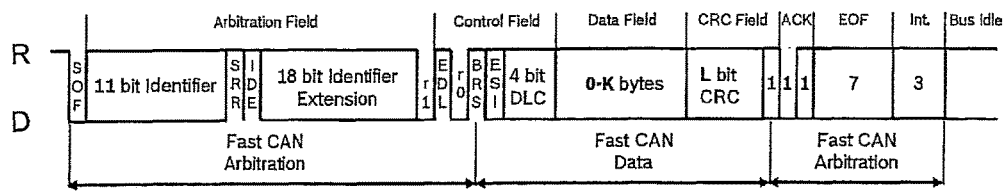

One possibility for identifying the messages having a shortened bit length in accordance with the present invention is shown in FIG. 6. Here, the messages having potentially longer data fields (associated: first identification K1) and modified CRC calculation (associated: third identification K3) are indicated by a recessive EDL (extended data length) bit, which takes the place of a bit transmitted dominantly in standard CAN messages and replaces this bit or shifts it backwards by one position. For the standard addressing, the EDL bit assumes the second position in the control field and shifts the always dominant r0 bit located there by one position. For the extended addressing, the EDL bit in the example shown assumes the first position of the control field and replaces the reserved r1 bit located there, which is always transmitted dominantly in standard CAN. An identification using the EDL bit could also be omitted in the circumstances described further above.

A (likewise optional) further or fourth identification K4, which announces the use of the shortened bit length, is represented by the insertion of an additional, recessive BRS (bit rate switch) bit into the control field of messages according to the present invention, which are indicated by the EDL bit. In the exemplary embodiment shown here, the position of the BRS bit is the fourth (standard addressing) or third (extended addressing) position in the control field.

The messages bear the label "CAN FD Fast". For the two possible addressing variants of messages, the standard format and the extended format, areas are drawn in in FIG. 6, in which a switchover is made between two states indicated as Fast CAN Arbitration and Fast CAN Data. This switchover between the two states has the effect, as already described, that the bit lengths are shortened for the corresponding part of the message and thus the individual bits are transmitted more quickly across the bus. This makes it possible to shorten the transmission time for a message compared to the standard-conforming method. The transition between the states of Fast CAN Arbitration and Fast CAN Data occurs in messages that have the first or third identification EDL, as a function of the fourth identification BRS, which signals to the subscribers of the data transmission that the shortened bit length is being used.

In the case shown, in which the first identification EDL is thus followed by the second identification BRS, messages are transmitted in the transmission method according to the present invention, the bit length of which is markedly shortened, the data field size of which is expandable to values above 8 bytes, and the CRC of which is adapted to the larger data field. A substantial increase of the transmission capacity via the bus system is thus achieved while the transmission reliability is at the same time improved.

In the example shown, the faster transmission begins immediately after the transmission of the associated identification and is ended immediately after reaching the bit defined for the reverse switchover or when a reason for starting an error frame was detected.

Figure 7:
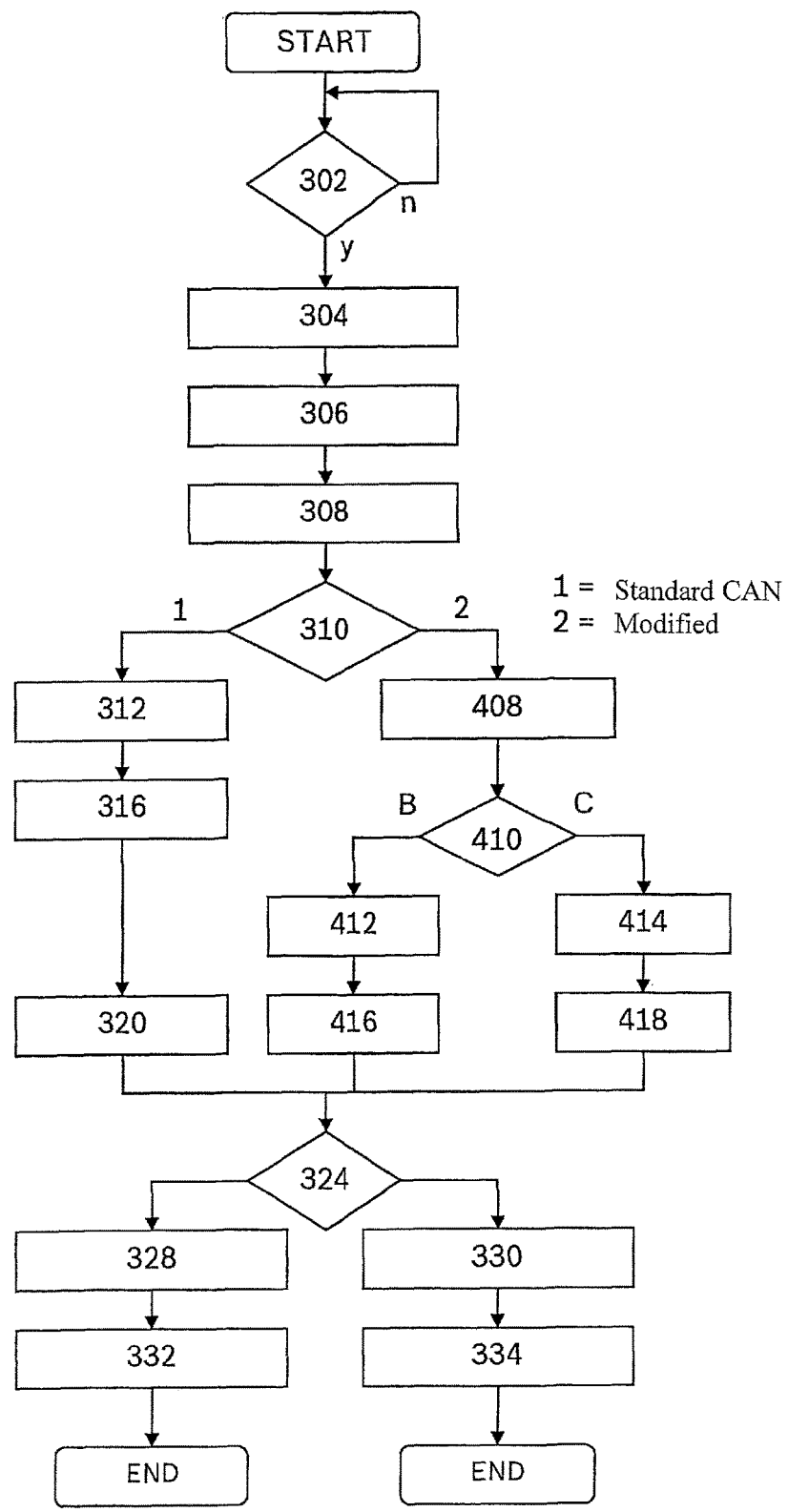
FIG. 7 shows a receiving process that is modified compared to FIG. 3.

FIG. 7 shows a receiving process that is modified compared to FIG. 3, in which additionally a switchover is made between the states of Fast CAN Arbitration and Fast CAN Data as a function of the second identification BRS. If it is known at branching 310, for example after receiving the second bit of the control field as the recessive EDL bit, that the communication method modified in accordance with the present invention is to be used, then the next bits of the control field are read in in block 408. If the bit used for the second identification, for example the fourth bit BRS of the control field extended in accordance with the present invention, is received with the provided value, for example recessively, then the state Fast CAN Data is assumed for example at the sample point of this bit, that is, a switchover is made to the shortened bit length (path "C"). If the respective bit has the opposite value, that is, dominant in this example, then the bit length is not shortened (path "B"). In blocks 412 or 414, the remaining bits of the control field including the data length code are received as well as the data field according to the size information from the data length code. Reception is at normal bit length in block 412, and at shortened bit length in block 414. In blocks 416 or 418, the CRC field deviating in accordance with the present invention, being in particular longer, is read in. In block 418, at the final bit of the CRC field, the CRC delimiter, a switchover is made back to the state of Fast CAN Arbitration at a normal bit rate. Subsequently, a check is performed at branching 324 analogous to FIG. 3 to determine whether the CRC checksum transmitted by the sender agrees with the CRC checksum ascertained by the receiver, and the further method is selected accordingly, as was already the case in FIG. 3.

The following calculation illustrates the utility in terms of the achieved data transmission rate of the exemplary embodiment shown in FIG. 5 in combination with the exemplary embodiment of the method indicated by DLC 3 having a modified size of the data field: We assume a length of the data field of 24 bytes, data frames in the standard format featuring 11-bit addressing, as well as a baud rate of 500 kbit/s. Moreover, it is assumed that the scaling factor according to "reserved bit" r0 is increased by a factor of four. In this case, the bit length would thus be reduced from 2 microseconds to 0.5 microseconds according to "reserved bit" r0. Ignoring possible stuff bits, in this example, per data frame, 27 bits (SOF, identifier, RTR, IDE, r0, ACK field, EOF, intermission) are transmitted at the normal bit length and 212 bits (DLC, data, CRC, CRC delimiter) are transmitted at the shortened bit length, a 15-bit CRC having still been assumed here, which, however, in accordance with the present invention could be replaced by a longer CRC.

Under the given boundary conditions, an effective transmission performance of 293 bits in 160 microseconds is achieved, which at an identical assumed bus capacity utilization corresponds to a data transmission rate that is increased by a factor of 3.7 compared to unmodified standard CAN transmission. Additionally, the ratio of useful data (data field) to protocol overhead shifts advantageously.

The method is suitable in the normal operation of a motor vehicle for transmitting data between at least two control units of the motor vehicle, which are connected via a suitable data bus. It may equally be used advantageously during the manufacturing or maintenance of a motor vehicle for transmitting data between a programming unit connected to a suitable data bus for programming purposes and at least one control unit of the motor vehicle that is connected to the data bus.

It is furthermore also possible to use the method in industrial automation, that is, for example in the transmission of control information between distributed control units interconnected by the bus, which control the course of an industrial manufacturing process. In this environment there may also be very long bus lines and it may be particularly practical to operate the bus system for the arbitration phase at a relatively long bit length, for example at 16, 32 or 64 microseconds, so that the bus signals, as required, are able to propagate through the entire bus system during the arbitration process. Subsequently, a switchover to shorter bit lengths may be performed for part of the message, as described, so as not to let the average transmission rate drop too low.

Overall, the method represents a transmission method that is characterized by the fact that a standard CAN controller only needs to be modified minimally in order to work in accordance with the present invention. A communications controller according to the present invention, which is also able to work as a standard CAN controller, is only negligibly larger than a conventional standard CAN controller. The associated application program does not need to be modified, and even then advantages in the speed of data transmission are already achieved. Using the extended size of the data field and the associated DLC and CRC makes it possible to increase the speed of data transmission further, while adaptations in the application software are minimal. Advantageously, substantial portions of the CAN conformance test (ISO 16845) may be adopted. It is also possible to combine the transmission method according to the present invention with the supplements of TTCAN (ISO 11898-4).

Where reference was made to ISO standards in the previous description of the present invention, the version of the respective ISO standard valid on the filing date is to be treated as the related art.

What is claimed is:

1. A method for serial data transmission in a bus system having at least two subscribed data processing units, the method comprising:
exchanging messages via the bus;
providing that the transmitted messages have a logical structure according to CAN standard ISO 11898-1, the logical structure including a start-of-frame bit, an arbitration field, a control field, a data field, a CRC field, an acknowledge field and an end-of-frame sequence;
providing that the control field includes a data length code, which contains information about the length of the data field;
wherein the data field of each of the messages is selectably variable to include a variable maximum number of bytes selected from eight bytes to more than eight bytes in deviation from the CAN standard ISO 11898-1, the values of the data length code being interpreted as least partially in deviation from the CAN standard ISO 11898-1 for determining the size of the data field of each respective message, and wherein the CRC field of transmitted messages has at least two different numbers of bits depending on the content of the data length code, the CRC field having a greater number of bits for a data length code indicating a longer data field than for a data length code indicating a shorter data field, wherein if the maximum number of bytes of the data field is eight bytes, the CRC field of transmitted messages has a predetermined number of bits independent of a content of the data length code, and wherein if the maximum number of bytes of the data field is more than eight bytes, the CRC field of transmitted messages has a number of bits depending on the content of the data length code.

2. The method of claim 1, wherein at least two different generator polynomials are used for defining the content of the CRC field as a function of the content of the data length code.

3. The method of claim 1, wherein for at least one valid value of the data length code, the number of bits in the CRC field and the generator polynomial used to define the content of the CRC field correspond to the CAN standard ISO 11898-1.

4. The method of claim 1, wherein the receiving process is adapted as a function of the number of bits in the CRC field in the transmitted message.

5. The method of claim 1, wherein at the beginning of a message the calculation of at least two CRC checksums is started in parallel using different generator polynomials and a decision is made as a function of the content of the data length code as to which result is used from one of the CRC calculations that were started in parallel.

6. The method of claim 1, wherein possible stuff bits within the segments of the message in front of the CRC field are also taken into account in at least one of the CRC calculations performed in parallel.

7. The method of claim 1, wherein each of the possible value combinations of the bits of the data length code is assigned to one of the admissible sizes of the data field.

8. The method of claim 1, wherein the content of the data length code is evaluated in the subscribed data processing units for determining the size of the data field and the receiving process is adapted to the size of the data field.

9. The method of claim 1, wherein the values between 0b0001 and 0b1000 of the data length code are used for the sizes of the data field between 1 and 8 bytes in accordance with the CAN standard ISO 11898-1 and the remaining values of the data length code are used for the additional admissible sizes of the data field up to the maximum possible size.

10. The method of claim 1, wherein the bit length in time assumes at least two different values within a message, the bit length in time being greater than or equal to a specified minimum value of approximately one microsecond for at least one first specifiable area within the message and the bit length in time in at least one second specifiable area within the message having a reduced value in comparison to the first area.

11. The method of claim 10, wherein the at least two different values of the bit length in time within a message are implemented by using at least two different scaling factors for setting the bus time unit relative to a smallest time unit or the oscillator clock pulse in ongoing operation.

12. The method of claim 10, wherein the messages in which the bit length in time within the message may assume at least two different values are recognizable by an identification in the control field.

13. The method of claim 1, wherein the messages are transmitted in a time-controlled manner in accordance with the method described in the TTCAN standard ISO 11898-4.

14. A device for serial data transmission in a bus system having at least two subscribed data processing units, comprising:
an exchange arrangement to exchange messages via the bus;
wherein the transmitted messages having a logical structure according to the CAN standard ISO 11898-1, the logical structure including a start-of-frame bit, an arbitration field, a control field, a data field, a CRC field, an acknowledge field and an end-of-frame sequence,
wherein the control field including a data length code, which contains information about the length of the data field, and
wherein the data field of each of the messages is selectably variable to include a variable maximum number of bytes selected from eight bytes to more than eight bytes in deviation from the CAN standard ISO 11898-1, the values of the data length code being interpreted as least partially in deviation from the CAN standard ISO 11898-1 for determining the size of the data field of each respective message, and wherein the CRC field of transmitted messages has at least two different numbers of bits depending on the content of the data length code, the CRC field having a greater number of bits for a data length code indicating a longer data field than for a data length code indicating a shorter data field, wherein if the maximum number of bytes of the data field is eight bytes, the CRC field of transmitted messages has a predetermined number of bits independent of a content of the data length code, and wherein if the maximum number of bytes of the data field is more than eight bytes, the CRC field of transmitted messages has a number of bits depending on the content of the data length code.

15. The device of claim 14, wherein at least two different generator polynomials are used for defining the content of the CRC field as a function of the content of the data length code.

16. The device of claim 15, wherein there is included a sufficient number of shift registers for calculating the content of the CRC field using the at least two different generator polynomials.

17. A method for serial data transmission in a bus system having at least two subscribed data processing units, for use in normal operation of a motor vehicle for transmitting data between the at least two subscribed data processing units of the motor vehicle, the method comprising:
    exchanging messages via the bus;
    providing that the transmitted messages have a logical structure according to CAN standard ISO 11898-1, the logical structure including a start-of-frame bit, an arbitration field, a control field, a data field, a CRC field, an acknowledge field and an end-of-frame sequence;
    providing that the control field includes a data length code, which contains information about the length of the data field;
    wherein the data field of each of the messages is selectably variable to include a variable maximum number of bytes selected from eight bytes to more than eight bytes in deviation from the CAN standard ISO 11898-1, the values of the data length code being interpreted as least partially in deviation from the CAN standard ISO 11898-1 for determining the size of the data field of each respective message, and wherein the CRC field of transmitted messages has at least two different numbers of bits depending on the content of the data length code, the CRC field having a greater number of bits for a data length code indicating a longer data field than for a data length code indicating a shorter data field, wherein if the maximum number of bytes of the data field is eight bytes, the CRC field of transmitted messages has a predetermined number of bits independent of a content of the data length code, and wherein if the maximum number of bytes of the data field is more than eight bytes, the CRC field of transmitted messages has a number of bits depending on the content of the data length code.

18. A method for serial data transmission in a bus system having at least two units, for use during the manufacturing or maintenance of a motor vehicle for transmitting data between a programming unit connected to the data bus for programming purposes and at least one control unit of the motor vehicle that is connected to the data bus, the method comprising:
    exchanging messages via the bus;
    providing that the transmitted messages have a logical structure according to CAN standard ISO 11898-1, the logical structure including a start-of-frame bit, an arbitration field, a control field, a data field, a CRC field, an acknowledge field and an end-of-frame sequence;
    providing that the control field includes a data length code, which contains information about the length of the data field;
    wherein the data field of each of the messages is selectably variable to include a variable maximum number of bytes selected from eight bytes to more than eight bytes in deviation from the CAN standard ISO 11898-1, the values of the data length code being interpreted as least partially in deviation from the CAN standard ISO 11898-1 for determining the size of the data field of each respective message, and wherein the CRC field of transmitted messages has at least two different numbers of bits depending on the content of the data length code, the CRC field having a greater number of bits for a data length code indicating a longer data field than for a data length code indicating a shorter data field, and wherein if the maximum number of bytes of the data field is eight bytes, the CRC field of transmitted messages has a predetermined number of bits independent of a content of the data length code, and wherein if the maximum number of bytes of the data field is more than eight bytes, the CRC field of transmitted messages has a number of bits depending on the content of the data length code.

\* \* \* \* \*